United States Patent
Clevenger et al.

(10) Patent No.: US 7,312,529 B2
(45) Date of Patent: Dec. 25, 2007

(54) STRUCTURE AND METHOD FOR PRODUCING MULTIPLE SIZE INTERCONNECTIONS

(75) Inventors: Lawrence Clevenger, LaGrangeville, NY (US); Mukta G. Farooq, Hopewell Junction, NY (US); Louis L. Hsu, Fishkill, NY (US); William F. Landers, Wappingers Falls, NY (US); Donna S. Zupanski-Nielsen, Yorktown Heights, NY (US); Carl J. Radens, LaGrangeville, NY (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 11/160,669

(22) Filed: Jul. 5, 2005

(65) Prior Publication Data
US 2007/0007665 A1    Jan. 11, 2007

(51) Int. Cl.
*H01L 23/48* (2006.01)
*H01L 23/52* (2006.01)
*H01L 23/40* (2006.01)

(52) U.S. Cl. ............... 257/738; 257/780; 257/E21.069; 257/E21.062; 438/613

(58) Field of Classification Search ............... 257/738, 257/700, 686, 778, 678, 737, 780, E23.06, 257/E23.061, E23.062, E23.069; 438/107
See application file for complete search history.

(56) References Cited
U.S. PATENT DOCUMENTS

| | | | |
|---|---|---|---|
| 6,222,277 B1 * | 4/2001 | Downes | 257/778 |
| 6,310,303 B1 * | 10/2001 | Luvara et al. | 174/261 |
| 6,624,004 B2 * | 9/2003 | Lee | 438/107 |
| 6,809,262 B1 * | 10/2004 | Hsu | 174/558 |
| 2001/0052647 A1 * | 12/2001 | Plepys et al. | 257/738 |
| 2002/0068381 A1 * | 6/2002 | Ference et al. | 438/108 |
| 2003/0030457 A1 * | 2/2003 | Akram | 324/755 |
| 2003/0114024 A1 * | 6/2003 | Miyagawa | 439/68 |
| 2004/0094842 A1 * | 5/2004 | Jimarez et al. | 257/772 |

* cited by examiner

*Primary Examiner*—Theresa T Doan
*Assistant Examiner*—Sarah K Harding
(74) *Attorney, Agent, or Firm*—Schmeiser, Olsen & Watts; Steven Capella

(57) ABSTRACT

An electrical structure and method comprising a first substrate electrically and mechanically connected to a second substrate. The first substrate comprises a first electrically conductive pad and a second electrically conductive pad. The second substrate comprises a third electrically conductive pad, a fourth electrically conductive pad, and a first electrically conductive member. The fourth electrically conductive pad comprises a height that is different than a height of the first electrically conductive member. The electrically conductive member is electrically and mechanically connected to the fourth electrically conductive pad. A first solder ball connects the first electrically conductive pad to the third electrically conductive pad. The first solder ball comprises a first diameter. A second solder ball connects the second electrically conductive pad to the first electrically conductive member. The second solder ball comprises a second diameter. The first diameter is greater than said second diameter.

18 Claims, 3 Drawing Sheets

STRUCTURE AND METHOD FOR PRODUCING MULTIPLE SIZE INTERCONNECTIONS

TECHNICAL FIELD

The present invention relates to an electrical structure for producing multiple size interconnections between substrates.

RELATED ART

Joining substrates together in electrical applications typically requires a large number of connections between the substrates. The substrates may not be large enough to accommodate the large number of connections. Therefore there exists a need to accommodate the large number of connections necessary to join substrates together in electrical applications.

SUMMARY OF THE INVENTION

The present invention provides an electrical structure, comprising: a first substrate comprising a first electrically conductive pad and a second electrically conductive pad; a second substrate comprising a third electrically conductive pad, a fourth electrically conductive pad, and a first electrically conductive member, wherein said electrically conductive member is electrically and mechanically connected to said fourth electrically conductive pad, wherein said fourth electrically conductive pad comprises a first height, wherein said first electrically conductive member comprises a second height, and wherein said first height comprises a different height than the second height; a first solder ball electrically and mechanically connecting said first electrically conductive pad to said third electrically conductive pad, wherein said first solder ball comprises a first diameter; and a second solder ball electrically and mechanically connecting said second electrically conductive pad to said first electrically conductive member, wherein said second solder ball comprises a second diameter, and wherein said first diameter is greater than said second diameter.

The present invention provides an electrical structure, comprising: a first substrate comprising a first electrically conductive pad and a second electrically conductive pad; a second substrate comprising a first layer and a second layer, wherein said first layer comprises a third electrically conductive pad, wherein said second layer comprises a fourth electrically conductive pad; a first solder ball electrically and mechanically connecting said first electrically conductive pad to said third electrically conductive pad, wherein said first solder ball comprises a first diameter; and a second solder ball electrically and mechanically connecting said second electrically conductive pad to said fourth electrically conductive pad, wherein said second solder ball comprises a second diameter, wherein said first diameter is greater than said second diameter, and wherein a first distance between said first substrate and said first layer is greater than a second distance between said first substrate and said second layer.

The present invention provides a method for forming an electrical structure, comprising: providing a first substrate comprising a first electrically conductive pad and a second electrically conductive pad; providing a second substrate comprising a third electrically conductive pad, a fourth electrically conductive pad, and a first electrically conductive member, wherein said electrically conductive member is electrically and mechanically connected to said fourth electrically conductive pad, wherein said fourth electrically conductive pad comprises a first height, wherein said first electrically conductive member comprises a second height, and wherein said first height comprises a different height than said second height; forming a first solder ball electrically and mechanically connecting said first electrically conductive pad to said third electrically conductive pad, wherein said first solder ball comprises a first diameter; and forming a second solder ball electrically and mechanically connecting said second electrically conductive pad to said first electrically conductive member, wherein said second solder ball comprises a second diameter, and wherein said first diameter is greater than said second diameter.

The present invention advantageously provides a structure and associated method to accommodate the large number of connections necessary to join substrates together in electrical applications.

DETAILED DESCRIPTION OF THE INVENTION

Figure 1:
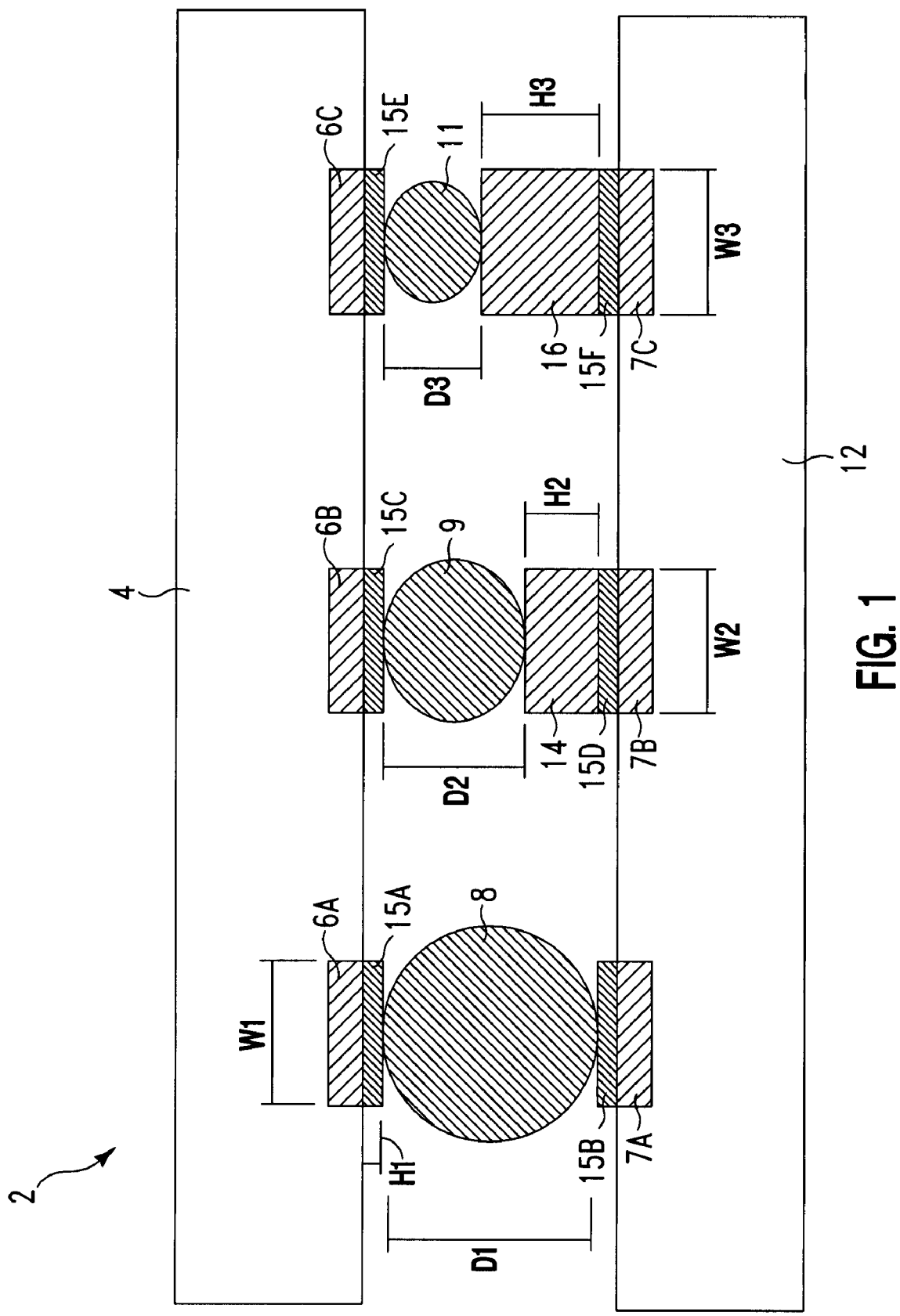
FIG. 1 illustrates a cross-sectional view of an electrical structure 2 having a substrate electrically and mechanically connected to a substrate using a plurality of different sized controlled collapse chip connection (C4) solder balls, in accordance with embodiments of the present invention

FIG. 1 illustrates a cross-sectional view of an electrical structure 2 having a substrate 4 electrically and mechanically connected to a substrate 12 using a plurality of different sized controlled collapse chip connection (C4) solder balls 8, 9, and 11, in accordance with embodiments of the present invention. Alternatively, the C4 solder balls 8, 9, and 11 may comprise any type of electrical interconnection for electrically and mechanically connecting a substrate 4 to a substrate 12. Note that the C4 solder balls 8, 9, and 11 are shown for illustration purposes and that an unlimited number of C4 solder balls similar to the C4 solder balls 8, 9, and 11 (or any type of interconnections) may be used to electrically and mechanically connect to the substrate 4 to the substrate 12. The C4 solder balls 8, 9, and 11 each comprise a different size (i.e., a different diameter). The different sized C4 solder balls 8, 9, and 11 are used to carry different types of signals between the substrate 4 and the substrate 12. For example, the largest C4 solder ball 8 may be used to carry a global power signal between the substrate 4 and the substrate 12, the next largest C4 solder ball 9 may be used to carry a local power signal between the substrate 4 and the substrate 12, and the smallest C4 solder ball 11 may be used to carry an input/output (I/O) signal between the substrate 4 and the substrate 12. A global power signal comprises a high power signal (e.g., high current in a range of about 100 mA to about 300 mA) used to power a plurality of devices on the substrate 4 and/or the substrate 12. A local power signal comprises a power signal (e.g., current in a range of less than about 100 mA) used to power one device on the substrate 4 or the substrate 12. The electrical structure 2 may include, inter alia, a high performance ball grid array (HyperBGA®) module. The electrical structure 2 comprising large C4 solder balls (e.g., C4 solder balls 8 and 9 for power signals comprising high current flow) and small C4 solder balls (e.g., C4 solder ball 11 for I/O signals comprising low current flow) allows for an increase of a packing density of the C4 solder balls (i.e., can fit more solder balls) within the electrical structure 2 over using single sized interconnections while maintaining current carrying capabilities of the interconnections. Additionally, the C4 solder balls 8 and 9 are placed on the electrically conductive member 14 and 16 respectively. This enables the C4 solder balls 8, 9, and 11 to each comprise a portion that is coplanar with respect to each other so that each of the solder balls 8, 9, and 11 may make contact with contact pads 15A, 15B, and 15C respectively and the substrate 4 may be placed about parallel with the substrate 12. The first substrate 4 and the second substrate 12 may include respectively, inter alia, a semiconductor device and a chip carrier, a semiconductor device and a printed circuit board, a chip carrier and a semiconductor device, a printed circuit board and a semiconductor device, a chip carrier and a printed circuit board, a printed circuit board and a chip carrier, etc. The semiconductor device may include, inter alia, a semiconductor chip. The chip carrier and the printed circuit board may include, inter alia, an organic or ceramic material. The C4 solder balls 8, 9, and 11 may comprise, inter alia, a high melt solder (i.e., the liquids temperature is greater than about 330° C.). Alternatively, the C4 solder balls 8, 9, and 11 may comprise a low melt solder comprising a Sn/Pb alloy composition such that the liquids temperature does not exceed about 260° C. The low melt solder 8 may include, inter alia, the compositions and melting points shown in Table 1.

TABLE 1

Solder Compositions

| Alloy | Composition (wt %) | Liquidus Temperature in Degrees Celsius |
|---|---|---|
| Eutectic Sn/Pb | 63Sn/37Pb | 183 |
| Sn/Ag/Pb | 62Sn/Ag2/Pb36 | 189 |
| In/Sn | In50/Sn50 | 125 |
| Sn/Ag/Cu | Sn95.75/Ag3.5/Cu0.75 | 221-227 |
| Sn/Cu | Sn99.3/Cu0.7 | 227 |
| Sn/Bi | Sn99.85/Bi0.15 | 232 |
| Sn/Ag | Sn97.5/Ag2.5 | 226 |

Contact pads 15A, 15C, and 15E are electrically and mechanically connected to wires 6A, 6B, and 6C respectively. Contact pads 15B, 15D, and 15F are electrically and mechanically connected to wires 7A, 7B, and 7C respectively. Each of the contact pads 15A . . . 15F comprises a height H1 and a width W1. Each of the contact pads 15A . . . 15F may comprise a different height H1 and a different width W1. Alternatively, each of the contact pads 15A . . . 15F may comprise a same height H1 and a same width W1. The height H1 may comprise a height selected from a range of less than about 25 um. The width W1 may comprise a width selected from a range of about 75 um to about 100 um. The C4 solder ball 8 electrically and mechanically connects electrically conductive pad 15A on the substrate 4 to the electrically conductive pad 15B on the substrate 12. D1 is the diameter of the C4 solder ball 8. The diameter D1 of the C4 solder ball 8 may comprise a diameter selected from a range of about 100 um to about 500 um. An electrically conductive member 14 is electrically and mechanically connected to the electrically conductive pad 15D on the substrate 12. The C4 solder ball 9 electrically and mechanically connects the electrically conductive pad 15C on the substrate 4 to the electrically conductive member 14 and therefore a combination of the C4 solder ball 9 and the electrically conductive member 14 electrically connects the electrically conductive pad 15C to the electrically conductive pad 15D. D2 is a diameter of the C4 solder ball 9. The diameter of the C4 solder ball 9 may comprise a diameter selected from a range of about 25 um to about 100 um. The electrically conductive member 14 has a height H2. The height H2 may comprise a same height as the height H1. Alternatively, the height H2 may comprise a different height as the height H1. The height H2 may comprise a height selected from a range of about 40 um to about 60 um. The electrically conductive member 14 has a width W2. The width W2 may comprise a same width as the width W1. Alternatively, the width W2 may comprise a different width as the width W1. The width W2 may comprise a width selected from a range of less than about 50 um. An electrically conductive member 16 is electrically and mechanically connected to an electrically conductive pad 15F on the substrate 12. The C4 solder ball 11 electrically and mechanically connects the electrically conductive pad 15E on the substrate 4 to the electrically conductive member 16 and therefore a combination of the C4 solder ball 11 and the electrically conductive member 16 electrically connects the electrically conductive pad 6C to the electrically conductive pad 7C. D3 is a diameter of the C4 solder ball 11. The diameter D3 of the C4 solder ball 11 may comprise a diameter selected from a range of about less than 25 um. The diameter D1 is greater than the diameter D2 and the diameter D2 is greater that the diameter D3. The electrically conductive member 16 has a height H3. The height H3 may comprise a same height as the height H1 and/or H2. Alternatively, the height H3 may comprise a different height as the height H1 and/or H2. The height H3 may comprise a height selected from a range of about 65 um to about 85 um. The electrically conductive member 16 has a width W3. The width W3 may comprise a same width as the width W1 and/or W2. Alternatively, the width W3 may comprise a different width as the width W1 and/or W2. The width W3 may comprise a width selected from a range of less than about 25 um.

Figure 2:
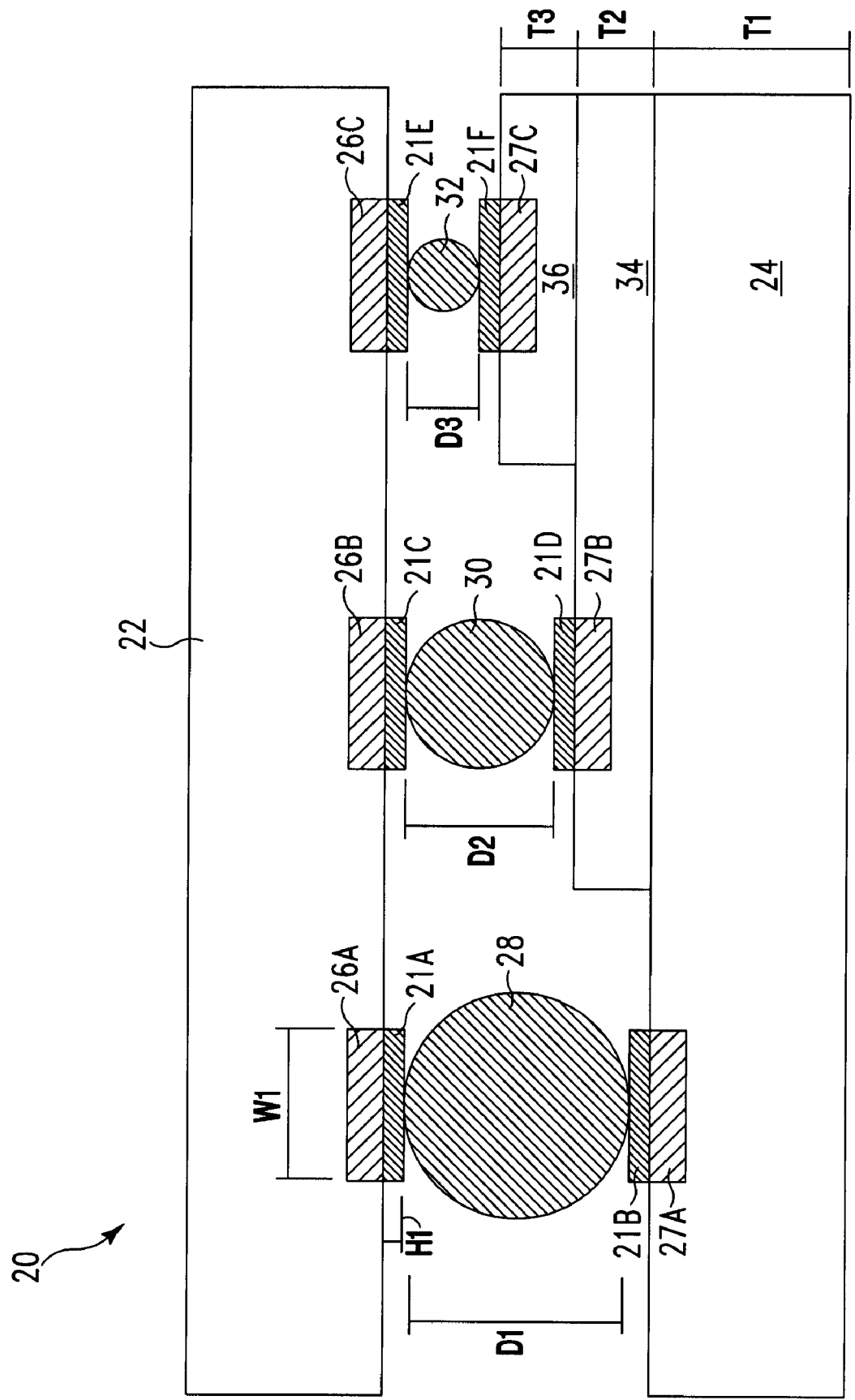
FIG. 2 illustrates a cross-sectional view of an electrical structure having a substrate electrically and mechanically connected to a substrate comprising a plurality of layers using a plurality of different sized controlled collapse chip connection (C4) solder balls, in accordance with embodiments of the present invention

FIG. 2 illustrates a cross-sectional view of an electrical structure 20 having a substrate 22 electrically and mechanically connected to a substrate 38 comprising a plurality of layers 24, 34, and 36 using a plurality of different sized controlled collapse chip connection (C4) solder balls 28, 30, and 32, in accordance with embodiments of the present invention. Alternatively, the C4 solder balls 28, 30, and 32 may comprise any type of electrical interconnection for electrically and mechanically connecting a substrate 22 to a substrate 38. Note that the C4 solder balls 28, 30, and 32 are shown for illustration purposes and that an unlimited number of C4 solder balls similar to the C4 solder balls 28, 30, and 32 (or any type of interconnections) may be used to electrically and mechanically connect to the substrate 22 to the substrate 38. The C4 solder balls 28, 30, and 32 each comprise a different size (i.e., a different diameter). The substrate 38 comprises layers 24, 34, and 36. Each of layers 24, 34, and 36 may be used for carrying different signal types (e.g., layer 24 carries global power supply signals, layer 34 carries local power supply signals, and layer 36 carries I/O signals). The different sized C4 solder balls 28, 30, and 32 are used to carry different types of signals between the substrate 22 and layers 24, 34, and 36 within the substrate 38. For example, the largest C4 solder ball 28 may be used to carry a global power signal between the substrate 22 and layer 24 within the substrate 24, the next largest C4 solder ball 30 may be used to carry a local power signal between the substrate 22 and layer 34 within the substrate 38, and the smallest C4 solder ball 32 may be used to carry an input/output (I/O) signal between the substrate 22 and layer 36 within the substrate 38. The electrical structure 20 may include, inter alia, a high performance ball grid array (HyperBGA®) module. The electrical structure 20 comprising large C4 solder balls (e.g., C4 solder balls 8 and 9 for power signals comprising high current flow) and small C4 solder balls (e.g., C4 solder ball 11 for I/O signals comprising low current flow) allows for an increase of a packing density of the C4 solder balls (i.e., can fit more solder balls) within the electrical structure 20 over using single sized interconnections while maintaining current carrying capabilities of the interconnections. Additionally, the layers 24, 34, and 36 each comprise a different level with respect to each other so that the C4 solder balls 28, 30, and 32 may be placed such that the C4 solder balls 28, 30, and 32 each comprise a portion that is coplanar with respect to each other so that each of the solder balls 28, 30, and 32 may make contact with the substrate 22 and the substrate 22 may be placed about parallel with the substrate 38. The first substrate 22 and the second substrate 38 may include respectively, inter alia, a semiconductor device and a chip carrier, a semiconductor device and a printed circuit board, a chip carrier and a semiconductor device, a printed circuit board and a semiconductor device, a chip carrier and a printed circuit board, a printed circuit board and a chip carrier, etc. The semiconductor device may include, inter alia, a semiconductor chip. The chip carrier and the printed circuit board may include, inter alia, an organic or ceramic material. The C4 solder balls 28, 30, and 32 may comprise, inter alia, a high melt solder (i.e., the liquids temperature is greater than about 330° C.) a low melt Sn/Pb solder (i.e., liquids temperature does not exceed about 260° C.) as described with respect to solder balls 8, 9, and 11 in the description of FIG. 1.

Contact pads 21A, 21C, and 21E are electrically and mechanically connected to wires 26A, 26B, and 26C respectively. Contact pads 21B, 21D, and 21F are electrically and mechanically connected to wires 27A, 27B, and 27C respectively. Each of the contact pads 21A . . . 21F comprises a height H1 and a width W1. Each of the contact pads 21A . . . 21F may comprise a different height H1 and a different width W1. Alternatively, each of the contact pads 21A . . . 21F may comprise a same height H1 and a same width W1. The height H1 may comprise a height selected from a range of less than about 25 um. The width W1 may comprise a width selected from a range of about 75 um to about 100 um. The C4 solder ball 28 electrically and mechanically connects an electrically conductive pad 21A on the substrate 22 to an electrically conductive pad 21B on layer 24 of the substrate 38. D1 is a diameter of the C4 solder ball 28. The diameter D1 of the C4 solder ball 28 may comprise a diameter selected from a range of about 100 um to about 500 um. The layer 24 comprises a thickness T1. The C4 solder ball 30 electrically and mechanically connects an electrically conductive pad 21C on the substrate 22 to an electrically conductive pad 21D on layer 34 of the substrate 38. D2 is a diameter of the C4 solder ball 30. The diameter D2 of the C4 solder ball 30 may comprise a diameter selected from a range of about 25 um to about 100 um. The layer 34 comprises a thickness T2. The C4 solder ball 32 electrically and mechanically connects an electrically conductive pad 21E on the substrate 22 to an electrically conductive pad 21F on layer 36 of the substrate 38. D3 is a diameter of the C4 solder ball 32. The diameter D3 of the C4 solder ball 32 may comprise a diameter selected from a range of about less than 25 um. The diameter D1 is greater than the diameter D2 and the diameter D2 is greater that the diameter D3. The layer 36 comprises a thickness T3. Each of the thicknesses T1, T2, and T3 may comprise a same thickness. Alternatively, each of the thicknesses T1, T2, and T3 may comprise a different thickness.

Figure 3:
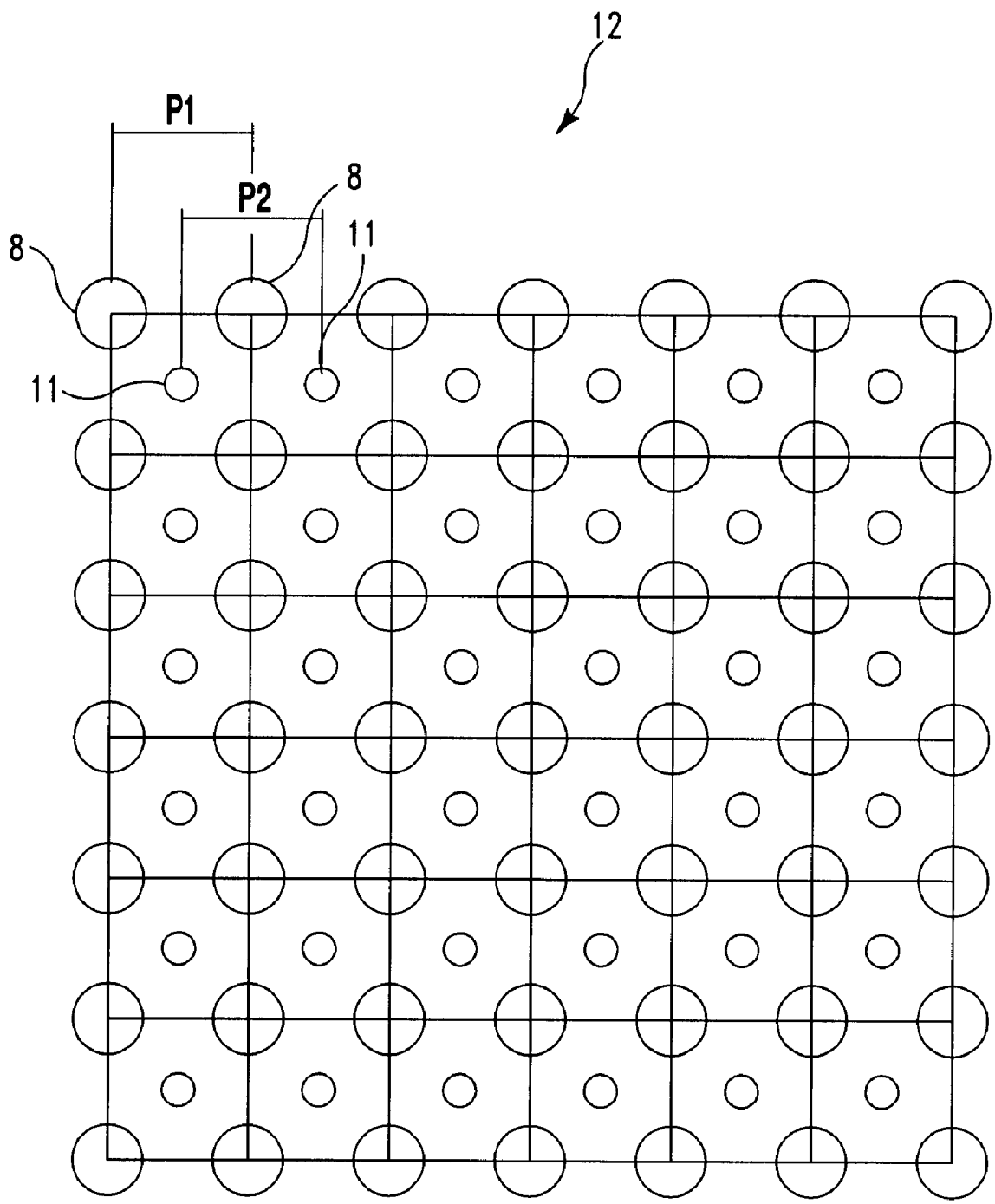
FIG. 3 illustrates a top view of the electrical structure of FIG. 1 comprising a plurality of C4 solder balls and a plurality of C4 solder balls, in accordance with embodiments of the present invention.

FIG. 3 illustrates a top view of the electrical structure 2 of FIG. 1 comprising a plurality of C4 solder balls 8 and a plurality of C4 solder balls 11 and without the C4 solder ball 9, in accordance with embodiments of the present invention.

The C4 solder balls 8 comprise a pitch P1 (i.e., a center to center measurement) between each adjacent C4 solder ball 8. The pitch P1 may be selected from a range of about 200 um to about 500 um. The C4 solder balls 11 comprise a pitch P2 (i.e., a center to center measurement) between each adjacent C4 solder ball 11. The pitch P2 may be selected from a range of about 50 um or less.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electrical structure, comprising:

a first substrate comprising a first electrically conductive pad, a second electrically conductive pad, and a fifth electrically conductive pad;

a second substrate comprising a third electrically conductive pad, a fourth electrically conductive pad, a sixth electrically conductive pad, a first electrically conductive member, and a second electrically conductive member, wherein said first electrically conductive member and said second electrically conductive member are not formed within a substrate, wherein said first electrically conductive member is electrically and mechanically connected to said fourth electrically conductive pad, wherein said second electrically conductive member is electrically and mechanically connected to said sixth electrically conductive pad, wherein said fourth electrically conductive pad comprises a first height, wherein said first electrically conductive member comprises a second height, wherein said first height comprises a different height than the second height, wherein said sixth electrically conductive pad comprises a third height, wherein said second electrically conductive member comprises a fourth height, wherein said third height comprises a different height than the fourth height, and wherein said fourth height of said second electrically conductive member comprises a different height than the second height of the first electrically conductive member;

a first solder ball electrically and mechanically connecting said first electrically conductive pad to said third electrically conductive pad, wherein said first solder ball is in direct mechanical contact with said first electrically conductive pad and said third electrically conductive pad, and wherein said first solder ball comprises a first diameter;

a second solder ball electrically and mechanically connecting said second electrically conductive pad to said first electrically conductive member, wherein said second solder ball comprises a second diameter, and wherein said first diameter is greater than said second diameter; and a third solder ball electrically and mechanically connecting said fifth electrically conductive pad to said second electrically conductive member, wherein said third solder ball comprises a third diameter, wherein said first diameter is greater than said third diameter, and wherein said third diameter is greater than said second diameter.

2. The electrical structure of claim 1, wherein said first substrate comprises a semiconductor device, and wherein said second substrate comprises a chip carrier.

3. The electrical structure of claim 1, wherein said first substrate comprises a chip carrier, and wherein said second substrate comprises a semiconductor device.

4. The electrical structure of claim 1, wherein said first substrate comprises a chip carrier, and wherein said second substrate comprises a printed circuit board.

5. The electrical structure of claim 1, wherein said fourth electrically conductive pad comprises a first width, wherein said first electrically conductive member comprises a second width, and wherein said first width comprises a different width than the second width.

6. The electrical structure of claim 1, wherein said first solder ball comprises a global power signal solder ball for carrying global power signals between said first substrate and said second substrate, wherein said second solder ball comprises an input/output (I/O) signal solder ball for carrying I/O signals between said first substrate and said second substrate, and wherein said third solder ball comprises a local power signal solder ball for carrying local power signals between said first substrate and said second substrate.

7. The electrical structure of claim 1, wherein said first solder ball and said second solder ball each comprise a substantially lead-free composition.

8. The electrical structure of claim 1, wherein said first electrically conductive pad and said second electrically conductive pad are each located on a first planer surface of said first substrate, and wherein said third electrically conductive pad and said fourth electrically conductive pad are each located on a second planer surface of said second substrate.

9. The electrical structure of claim 1, wherein said second height of the first electrically conductive member comprises a greater height than said fourth height of said second electrically conductive member.

10. A method for forming an electrical structure, comprising:
providing a first substrate comprising a first electrically conductive pad, a second electrically conductive pad, and a fifth electrically conductive pad;
providing a second substrate comprising a third electrically conductive pad, a fourth electrically conductive pad, a sixth electrically conductive pad, a first electrically conductive member, and a second electrically conductive member, wherein said first electrically conductive member and said second electrically conductive member are not formed within a substrate, wherein said electrically conductive member is electrically and mechanically connected to said fourth electrically conductive pad, wherein said second electrically conductive member is electrically and mechanically connected to said sixth electrically conductive pad, wherein said fourth electrically conductive pad comprises a first height, wherein said first electrically conductive member comprises a second height, wherein said first height comprises a different height than said second height, wherein said sixth electrically conductive pad comprises a third height, wherein said second electrically conductive member comprises a fourth height, wherein said third height comprises a different height than the fourth height, and wherein said fourth height of said second electrically conductive member comprises a different height than the second height of the first electrically conductive member;
forming a first solder ball electrically and mechanically connecting said first electrically conductive pad to said third electrically conductive pad, wherein said first solder ball is in direct mechanical contact with said first electrically conductive pad and said third electrically conductive pad, and wherein said first solder ball comprises a first diameter;
forming a second solder ball electrically and mechanically connecting said second electrically conductive pad to said first electrically conductive member, wherein said second solder ball comprises a second diameter, and wherein said first diameter is greater than said second diameter; and
forming a third solder ball electrically and mechanically connecting said fifth electrically conductive pad to said second electrically conductive member, wherein said third solder ball comprises a third diameter, wherein said first diameter is greater than said third diameter, and wherein said third diameter is greater than said second diameter.

11. The method of claim 10, wherein said first substrate comprises a semiconductor device, and wherein said second substrate comprises a chip carrier.

12. The method of claim 10, wherein the chip carrier is selected from the group consisting an organic chip carrier and a ceramic chip carrier.

13. The method of claim 10, wherein said first substrate comprises a chip carrier, and wherein said second substrate comprises a semiconductor device.

14. The method of claim 10, wherein said fourth electrically conductive pad comprises a first width, wherein said first electrically conductive member comprises a second width, and wherein said first width comprises a different width than the second width.

15. The method of claim 10, wherein said first solder ball comprises a global power signal solder ball for carrying global power signals between said first substrate and said second substrate, wherein said second solder ball comprises an input/output (I/O) signal solder ball for carrying I/O signals between said first substrate and said second substrate, and wherein said third solder ball comprises a local power signal solder ball for carrying local power signals between said first substrate and said second substrate.

16. The method of claim 10, wherein said first solder ball and said second solder ball each comprise a substantially lead-free composition.

17. The method of claim 10, wherein said first electrically conductive pad and said second electrically conductive pad are each located on a first planer surface of said first substrate, and wherein said third electrically conductive pad and said fourth electrically conductive pad are each located on a second planer surface of said second substrate.

18. The method of claim 10, wherein said second height of the first electrically conductive member comprises a greater height than said fourth height of said second electrically conductive member.

* * * * *